US009118282B2

(12) United States Patent
Choi et al.

(10) Patent No.: US 9,118,282 B2
(45) Date of Patent: Aug. 25, 2015

(54) POWER AMPLIFIER AND AMPLIFICATION METHOD THEREOF

(75) Inventors: Yun Ho Choi, Daejeon (KR); Nam Sik Ryu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 13/476,854

(22) Filed: May 21, 2012

(65) Prior Publication Data

US 2013/0127528 A1 May 23, 2013

(30) Foreign Application Priority Data

Nov. 21, 2011 (KR) ........................ 10-2011-0121476

(51) Int. Cl.
*H03F 3/68* (2006.01)
*H03F 3/21* (2006.01)
*H03F 1/02* (2006.01)

(52) U.S. Cl.
CPC .............. *H03F 3/211* (2013.01); *H03F 1/0261* (2013.01); *H03F 1/0288* (2013.01); *H03F 2200/537* (2013.01); *H03F 2200/541* (2013.01)

(58) Field of Classification Search
CPC ... H03F 1/0288; H03F 1/56; H03F 2200/387; H03F 2200/451; H03F 3/211; H03F 3/602; H03F 3/195; H03F 1/32; H03F 1/0277; H03F 3/68; H03F 3/189; H03F 2200/541
USPC .......................... 330/53, 54, 124 R, 286, 295
See application file for complete search history.

(56) References Cited

U.S. PATENT DOCUMENTS

| | | | | |
|---|---|---|---|---|
| 5,420,537 A | * | 5/1995 | Weedon et al. | 330/251 |
| 6,480,465 B1 | * | 11/2002 | Luu | 330/124 R |
| 6,545,542 B2 | * | 4/2003 | Matsuyoshi et al. | 330/124 R |
| 6,731,166 B1 | * | 5/2004 | Sabouri et al. | 330/124 R |
| 7,365,602 B2 | * | 4/2008 | Bhatti et al. | 330/295 |
| 7,952,433 B2 | * | 5/2011 | An et al. | 330/295 |
| 8,339,196 B2 | | 12/2012 | Hong et al. | |
| 8,432,218 B1 | * | 4/2013 | Rudell et al. | 330/124 R |

FOREIGN PATENT DOCUMENTS

| | | |
|---|---|---|
| KR | 10-2010-0068227 A | 6/2010 |
| KR | 10-2011-0068439 A | 6/2011 |

OTHER PUBLICATIONS

Hyeong-Tae Jeong et al., "Design of Doherty Amplifier With Push-Pull Structure Using BALUN Transform", The Institute of Electronic Engineering, Apr. 2004, pp. 51-58, vol. 41 No. 4.
Gang Liu et al., "Fully Integrated CMOS Power Amplifier With Efficiency Enhancement at Power Back-Off", IEEE Journal Of Solid-State Circuits, Mar. 2008, pp. 600-609, vol. 43, No. 3.

* cited by examiner

*Primary Examiner* — Khanh V Nguyen

(57) ABSTRACT

Provided are a power amplifier and a method thereof. The power amplifier power amplifier includes: a main amplifying unit receiving power; an auxiliary amplifying unit connected in parallel to the main amplifying unit; and a Balun transformer combined with the main amplifying unit and the auxiliary amplifying unit. Respectively different bias voltages are applied to the main amplifying unit and the auxiliary amplifying unit.

19 Claims, 6 Drawing Sheets

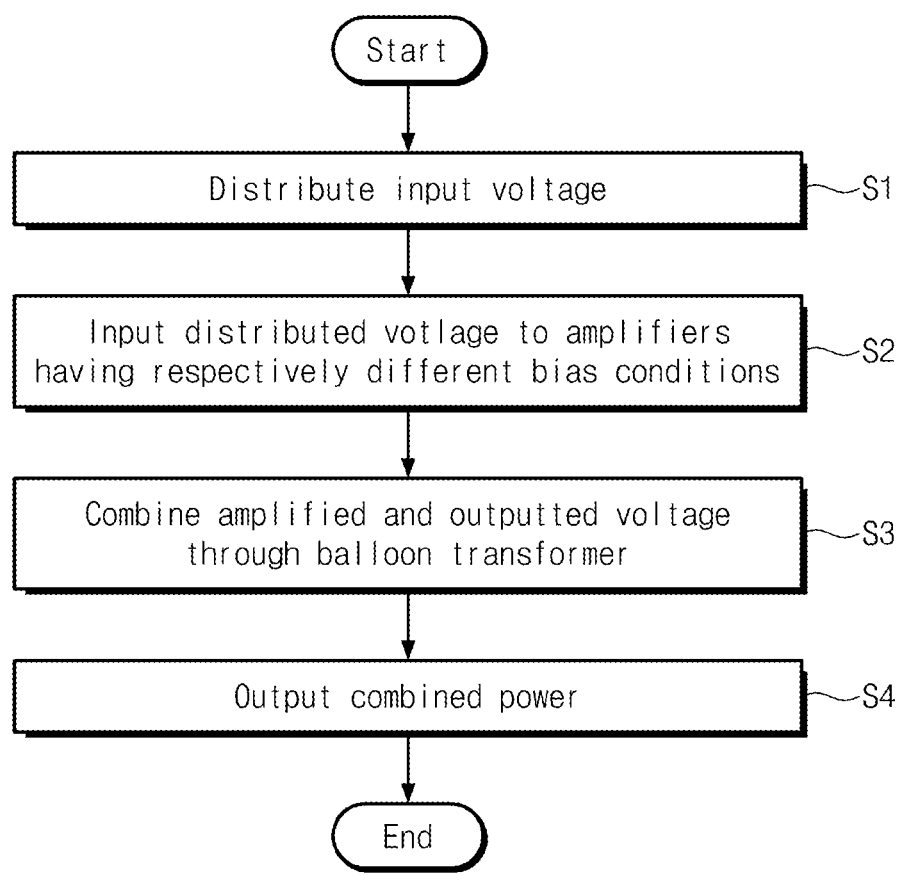

POWER AMPLIFIER AND AMPLIFICATION METHOD THEREOF

CROSS-REFERENCE TO RELATED APPLICATIONS

This U.S. non-provisional patent application claims priority under 35 U.S.C. §119 of Korean Patent Application No. 10-2011-0121476, filed on Nov. 21, 2011, the entire contents of which are hereby incorporated by reference.

BACKGROUND OF THE INVENTION

The present invention disclosed herein relates to a power amplifier and an amplification method thereof.

Due to the recent development of wireless communication system techniques, an integrated design system that integrates a plurality of systems into one device is generally used. In such devices, many components operate and consume power simultaneously. Thus, a highly efficient power amplifier is required to increase the efficient use of power. Moreover, since a digital modulated signal used in a wireless communication system has a high peak-to-average power ratio, power amplifiers require both high efficiency and excellent linearity.

In order to maintain power amplifier linearity, a back off method is generally used. The back off method allows a power amplifier to operate at an output of about 10 dB less than the maximum output. To implement this, an amplifier must be designed that dynamically changes the loads of some components in order to have high efficiency at a lower-than-maximum output.

SUMMARY OF THE INVENTION

The present invention provides a power amplifier having high efficiency and excellent linearity by using a transformer and an amplification method thereof.

Embodiments of the present invention provide power amplifiers including: a main amplifying unit receiving power; an auxiliary amplifying unit connected in parallel to the main amplifying unit; and a Balun transformer combined with the main amplifying unit and the auxiliary amplifying unit, wherein different bias voltages are applied to the main amplifying unit and the auxiliary amplifying unit.

In some embodiments, the Balun transformer may have a transformation ratio of 1:1.

In other embodiments, a voltage input to the main amplifying unit and the auxiliary amplifying unit may be distributed by the Balun transformer.

In still other embodiments, a bias condition of the main amplifying unit may be class AB.

In even other embodiments, a bias condition of the auxiliary amplifying unit may be class C.

In yet other embodiments, the main amplifying unit may include a first main amplifier and a second main amplifier; and different bias voltages may be input to the first main amplifier and the second main amplifier.

In further embodiments, the auxiliary amplifying unit may include a first auxiliary amplifier and a second auxiliary amplifier; and different bias voltages may be input to the first auxiliary amplifier and the second auxiliary amplifier.

In still further embodiments, an offset line may be connected to the auxiliary amplifying unit.

In other embodiments of the present invention, power amplifying methods include: distributing an input voltage as first and second input voltages; applying the first and second input voltages to first and second amplifiers having different bias conditions, respectively; combining voltages output from the first and second amplifiers by using a Balun transformer; and outputting the combined voltages as an output voltage by using the Balun transformer.

In some embodiments, the Balun transformer may have a transformation ratio of 1:1.

In other embodiments, each of the first and second amplifiers may include an offset line.

In still other embodiments, a bias condition of the first amplifier may be class AB.

In even other embodiments, a bias condition of the second amplifier may be class C.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 8 is a flowchart illustrating a power amplifying method of a power amplifier according to an embodiment of the present invention.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
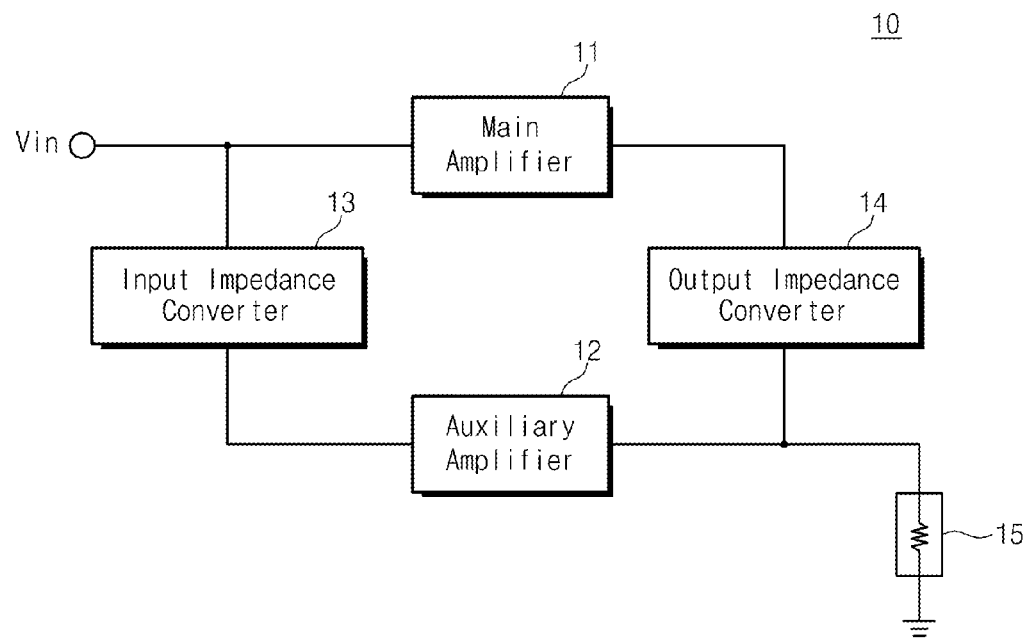
FIG. 1 is a block diagram illustrating a power amplifier according to an embodiment of the present invention.

FIG. 1 is a block diagram illustrating a power amplifier according to an embodiment of the present invention. Referring to FIG. 1, the power amplifier 10 includes a main amplifier 11, an auxiliary amplifier 12, an input impedance converter 13, an output impedance converter 14, and a load 15. That is, the power amplifier 10 is configured through the Doherty method. Once an input voltage Vin is input to the power amplifier 10, it is distributed into the main amplifier 11 and the auxiliary amplifier 12 through a voltage distributor (not shown). Voltages, which are amplified by the main amplifier 11 and the auxiliary amplifier 12 of the power amplifier 10, are combined and then delivered to the load 15.

The main amplifier 11 has a wide range of linearity. For this, the main amplifier 11 may operate under a bias condition of class A, class B, or class AB. In relation to the bias condition applied to the main amplifier 11, the class A has more excellent linearity but somewhat less efficiency than the class B. In this embodiment, the main amplifier 11 operates under a bias condition of the class AB having an average property of the class A and the class B.

The auxiliary amplifier 12 has limited linearity (i.e., only operating under a high voltage condition) but high efficiency. For this, the auxiliary amplifier 12 may operate under the bias condition of the class C. In relation to a bias condition applied to the auxiliary amplifier 12, it means that the class C only operates under a high input voltage condition in which a bias of class A, class B, or class AB is saturated.

The input impedance converter 13 is inserted to compensate for a phase difference between the main amplifier 11 and the auxiliary amplifier 12. The input impedance converter 13 may be implemented with a microstrip line. In this embodiment, the input impedance converter 13 is a microstrip line having a phase delay of 90°.

The output impedance converter 14 is inserted for impedance matching between the amplifiers and the load 15. The output impedance converter 14 serves to change output impedances from the main amplifier 11 and the auxiliary amplifier 12 when an input voltage changes. The output impedance converter 14 may be implemented with a microstrip line.

Figure 2:
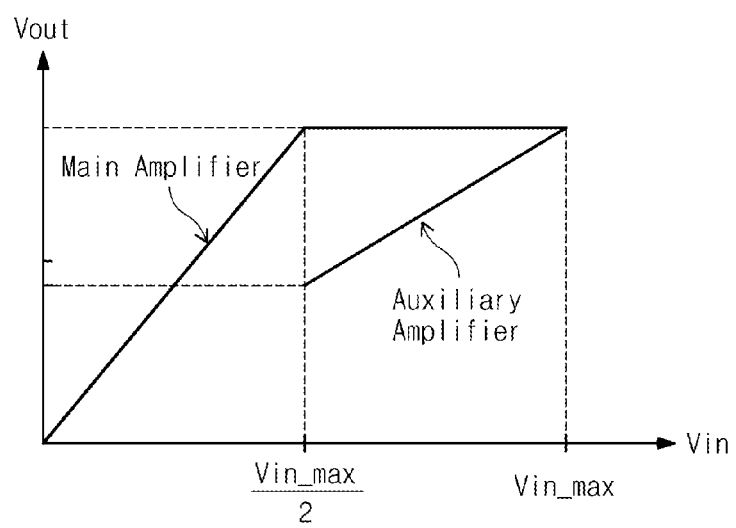
FIG. 2 is a graph illustrating output voltages with respect to output voltages of a main amplifier and an auxiliary amplifier.
Figure 3:
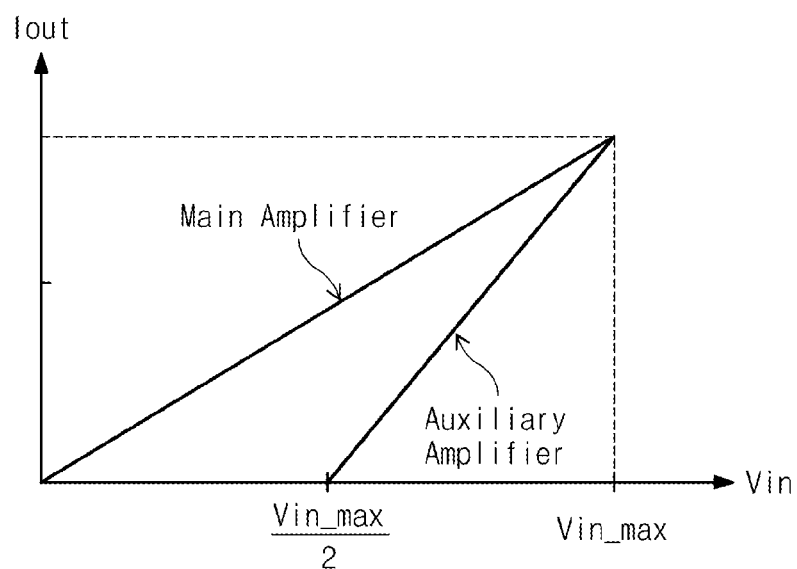
FIG. 3 is a graph illustrating currents with respect to input voltages of a main amplifier and an auxiliary amplifier.

FIGS. 2 and 3 are graphs illustrating operations of the main amplifier 11 and the auxiliary amplifier 12 of FIG. 1 in more detail. Referring to FIGS. 2 and 3, the main amplifier 11 operates linearly until an input voltage becomes $V_{in\_max}/2$. At this point, $V_{in\_max}/2$ is the maximum input voltage at which an output voltage is unsaturated. The main amplifier 11 is saturated at an input voltage higher than that.

On the contrary, the auxiliary amplifier 12 does not operate at a low input voltage, i.e., an input voltage less than $V_{in\_max}/2$. Furthermore, the auxiliary amplifier 12 operates linearly until $V_{in\_max}/2$ becomes $V_{in\_max}$.

Figure 4:
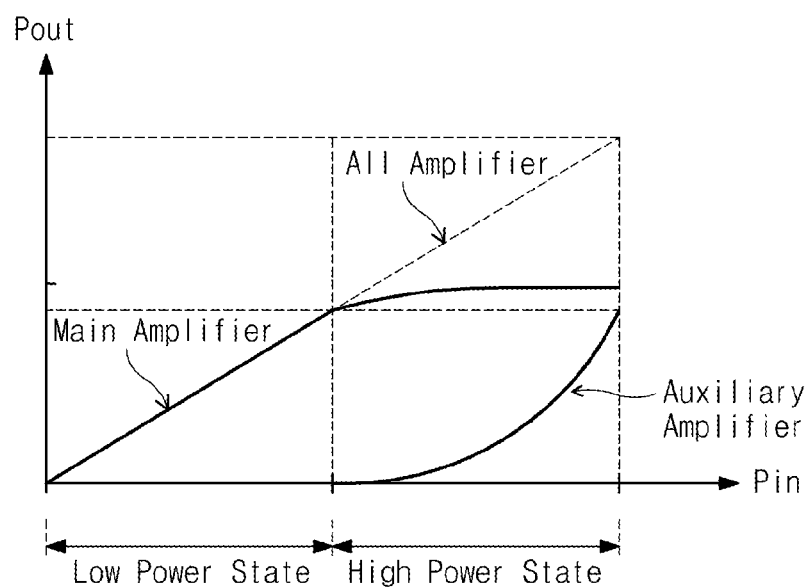
FIG. 4 is a graph illustrating all operations of the power amplifier of FIG. 1.

FIG. 4 is a graph illustrating all operations of the power amplifier 10 of FIG. 1. Only the main amplifier 11 operates linearly in a low voltage interval. The auxiliary amplifier 12 is in an off-state, and operates like an open circuit. As voltage becomes increased, i.e., an input voltage is equal to or more than $V_{in\_max}/2$, the main amplifier 11 is saturated. Moreover, the auxiliary amplifier 12 operates linearly. If an input voltage becomes equal to or more than $V_{in\_max}$, both the main amplifier 11 and the auxiliary amplifier 12 are saturated. At this point, the power amplifier 10 has the maximum output.

All operations of the power amplifier 10 include operations of the main amplifier 11 and the auxiliary amplifier 12. Accordingly, the power amplifier 10 maintains linearity in a wider range than an amplifier having one bias condition. That is, the linearity criteria P1 dB of the power amplifier 10 is improved by about 3 dB than when there is only one amplifier. Additionally, the auxiliary amplifier 12 does not operate under a low power condition. That is, the auxiliary amplifier 12 does not consume DC power, so that the power amplifier 10 becomes highly efficient.

However, the power amplifier 10 has an issue related to an output impedance change because the auxiliary amplifier 12 changes into an on or off state. Moreover, the auxiliary amplifier 12 is ideally supposed to operate as an open circuit when it is in an off state, but does not operate as the open circuit actually. In addition, a parasite capacitance exists at an output terminal of a transistor. The parasite capacitance lowers an output impedance of a transistor to a very low level. Due to this, there is another issue related to an RF gain change.

Furthermore, a Complementary Metal-Oxide Semiconductor (CMOS) power amplifier is mainly implemented in the form of a differential cascode structure. However, a power amplifier in a recent developing Wibro system requires a high Peak-to-Average Power Ratio (PAPR) and high output power.

In order to resolve the above issues, another embodiment of the present invention provides a method of combining voltages by using a Balun transformer in a plurality of power amplifiers. Through this, a Balun transformer may be used in an improved CMOS voltage amplifier without an additional circuit.

Figure 5:
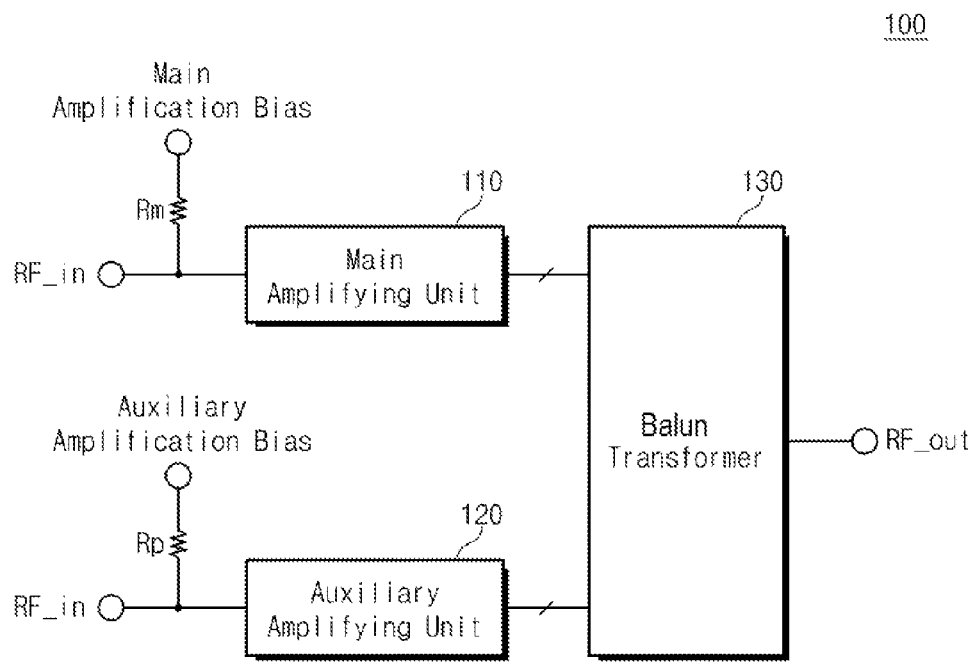
FIG. 5 is a view of a power amplifier according to an embodiment of the present invention.

FIG. 5 is a view of a power amplifier according to an embodiment of the present invention. Referring to FIG. 5, the power amplifier 100 includes a main amplifying unit 110, an auxiliary amplifying unit 120, and a Balun transformer 130. The power amplifier 100 may be a CMOS power amplifier used for terminals such as a mobile phone, a portable computer, a PDA, a radio, and a pager. An input voltage RF_in input in the power amplifier 100 is applied to the main amplifying unit 110 and the auxiliary amplifying unit 120 through a voltage distributor (not shown). The voltage distributor may be configured using a Balun transformer.

The main amplifying unit 110 and the auxiliary amplifying unit 120 have different bias conditions. The bias condition is input through bias applying resistances Rm and Rp. The main amplifying unit 110 and the auxiliary amplifying unit 120 may amplify and output the distributed voltage. The Balun transformer 130 combines voltages output from the main amplifying unit 110 and the auxiliary amplifying unit 120. Additionally, the Balun transformer 130 outputs the combined voltage RF_out.

Figure 6:
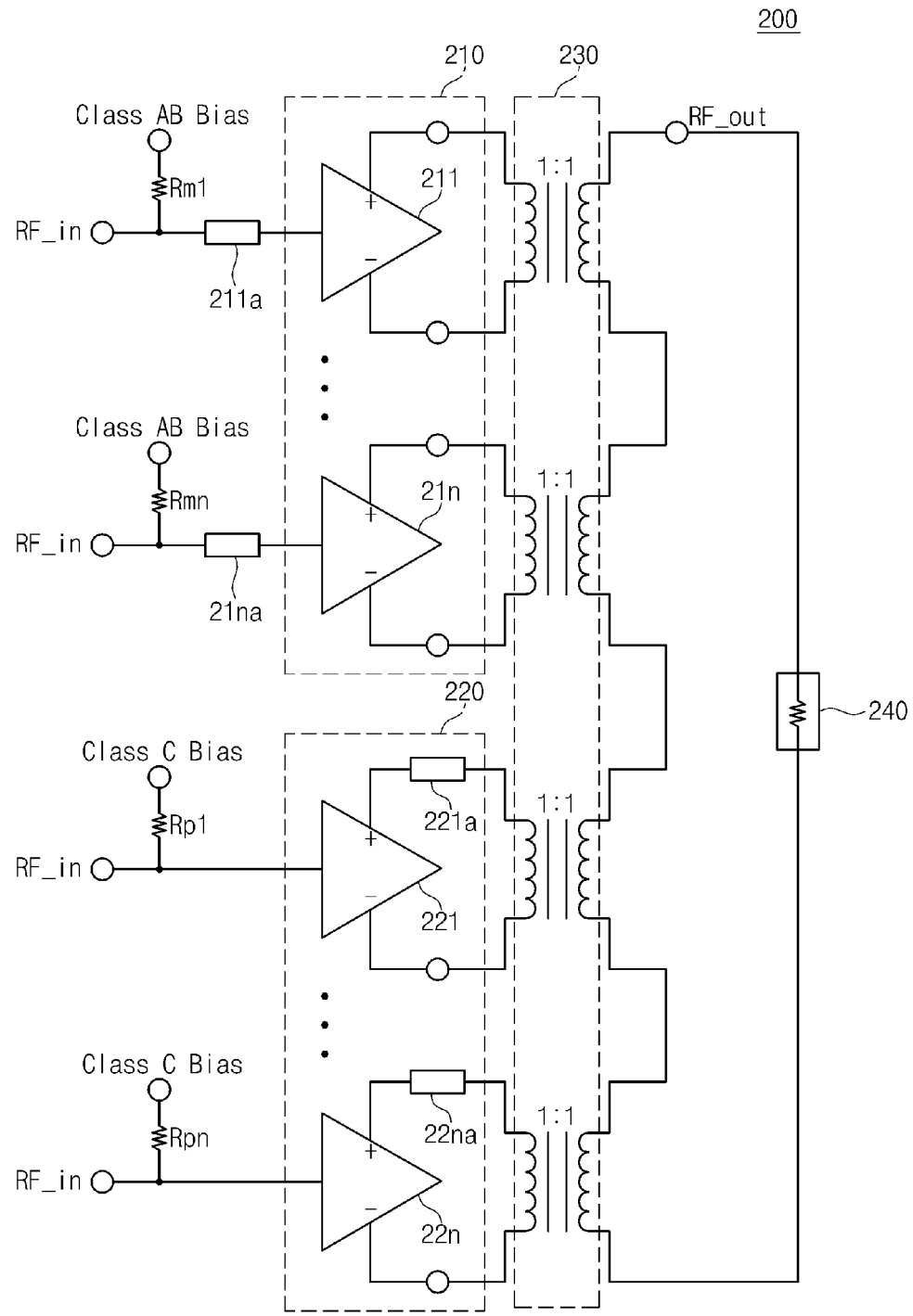
FIG. 6 is a detailed view when a load is added on the power amplifier of FIG. 5.

FIG. 6 is a detailed view when a load is added on the power amplifier 100 of FIG. 5. Referring to FIG. 6, the power amplifier 200 includes a main amplifying unit 210, an auxiliary amplifying unit 220, a Balun transformer 230, and a load 240. An input voltage RF_in input to the power amplifier 200 is applied to the main amplifying unit 210 and the auxiliary amplifying unit 220 through a voltage distributor (not shown).

The main amplifying unit 210 includes at least one main amplifier 211 to 21n. The main amplifying unit 210 has a wide range of linearity. For this, the main amplifying unit 210 may operate under class A, class B, or class AB. The bias is applied through bias applying resistances Rm1 to Rmn. In this embodiment, the main amplifying unit 210 operates under a bias condition of the class AB having an average property of the class A and class B.

The auxiliary amplifying unit 220 includes at least one auxiliary amplifier 221 to 22n. The auxiliary amplifying unit 220 has limited linearity (i.e., only operating under a high voltage condition) but high efficiency. For this, the auxiliary amplifying unit 220 may operate under the bias condition of the class C. The bias is applied through bias applying resistances Rp1 to Rpn.

The Balun transformer 230 is combined with the output terminals of the main amplifying unit 210 and the auxiliary amplifying unit 220. The Balun transformer 230 may receive differential outputs of the main amplifying unit 210 and the auxiliary amplifying unit 220. In this embodiment, a transformation ratio of the Balun transformer 230 is 1:1. However, the transformation ratio may vary. The Balun transformer 230 combines the outputs of the main amplifying unit 210 and the auxiliary amplifying unit 220. Also, the Balun transformer 230 delivers the combined power RF_out to the load 240.

Hereinafter, operations of the power amplifier 200 in a low power state, for example, before a 6 dB back off state, will be described below. The main amplifying unit 210 in a low power state is in a linear operation state. An output of the main amplifying unit 210 is combined by the Balun transformer 230 and then is delivered to the load 240. Accordingly, a load impedance seen from the main amplifying unit 210 is modulated by the Balun transformer 230. For example, let's assume in this embodiment that a voltage input to each main amplifying unit 210 is same. Then, a load impedance seen from the main amplifying unit 210 is reduced to 1/n. Due to this load modulation property, the main amplifying unit 210 linearly operates until a 6 dB back off point.

The auxiliary amplifying unit 220 in a low power state is in an off state. Accordingly, the auxiliary amplifying unit 220 operates as an open circuit. That is, the auxiliary amplifying unit 220 does not consume unnecessary DC power, thereby improving efficiency of the power amplifier 200. However, the actual auxiliary amplifying unit 220 is not ideally opened. To compensate for this, an offset line 221a to 22na may be added to the auxiliary amplifying unit 220. Through this, an electrical length is added to the auxiliary amplifying unit 220, so that an output impedance of the auxiliary amplifying unit 220 becomes close to an open circuit. Additionally, in order to compensate for the time delay resulting from the added electrical path of the auxiliary amplifying unit 220, the same offset line 211a to 21na may be added to the input terminal of the main amplifying unit 210.

Hereinafter, operations of the power amplifier 200 in a high power state, for example, after a 6 dB back off state, will be described below. The main amplifying unit 210 in a high power state is in a saturation state. Accordingly, the main amplifying unit 210 maintains the maximum efficiency characteristic up to the maximum output area, i.e., an area that the auxiliary amplifying unit 220 is saturated. An output of the main amplifying unit 210 is combined by the Balun transformer 230 and then is delivered to the load 240.

The auxiliary amplifying unit 220 in a high power state operates in a linear state. An output of the auxiliary amplifying unit 220 is combined by the Balun transformer 230 and then is delivered to the load 240.

At this point, when it reaches the maximum output area, i.e., an area that the auxiliary amplifying unit 220 is saturated, both the main amplifying unit 210 and the auxiliary amplifying unit 220 are saturated. At this point, the power amplifier 200 shows the maximum efficiency. If a ratio of amplifiers of the main amplifying unit 210 and the auxiliary amplifying unit 220 is 1:1, each amplifier provides the half of an entire output power. Additionally, it is seen from each amplifier that the load impedance is equally distributed.

Figure 7:
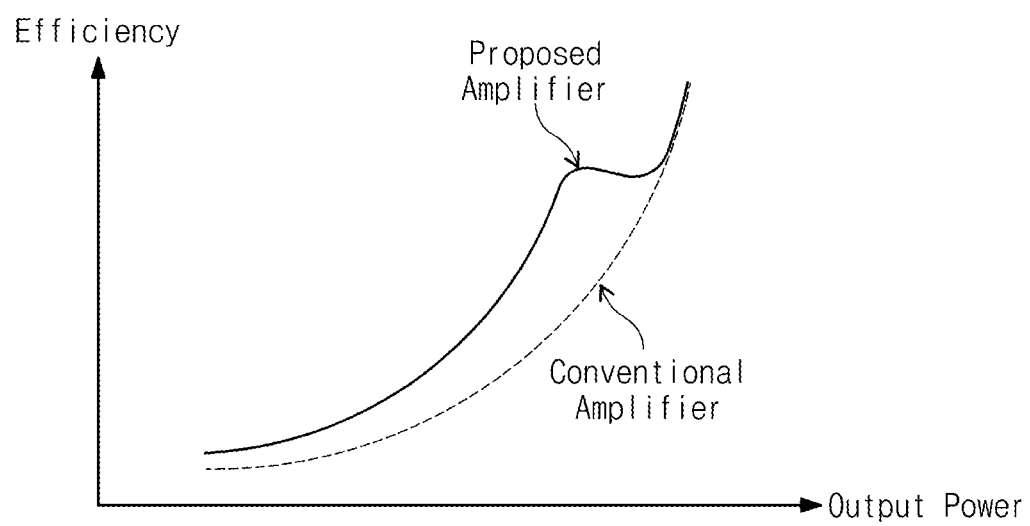
FIG. 7 is a graph illustrating efficiency of a typical power amplifier and efficiency of a power amplifier suggested from the present invention.

FIG. 7 is a graph illustrating efficiency of a typical power amplifier and efficiency of a power amplifier suggested from the present invention. Referring to FIG. 7, it is observed that the power amplifier of the present invention has high efficiency because the auxiliary amplifier does not operate when operating in a lower power in comparison with a typical power amplifier.

FIG. 8 is a flowchart illustrating a power amplifying method of a power amplifier according to an embodiment of the present invention. First, once an input voltage is applied to the power amplifier, a voltage distributor distributes an input voltage into a first amplifier (e.g., a main amplifying unit) and a second amplifier (e.g., an auxiliary amplifying unit) in operation S1. That is, the distributed voltage is input into the main amplifying unit and the auxiliary amplifying unit in operation S2. The voltage amplified by the main amplifying unit and the auxiliary amplifying unit is combined through a Balun transformer in operation S3. The Balun transformer outputs the combined power in operation S4.

In the above embodiment, the main amplifiers 211 to 21n in the main amplifying unit 210 operate under the same bias condition, for example, class AB, but the present invention is not limited thereto. A bias condition may be given gradually between the main amplifiers 211 to 21n. This is identically applied to the auxiliary amplifying unit 220.

As described above, the power amplifier suggested by the present invention utilizes a Balun transformer for voltage combination. Accordingly, an impedance transformer does not need to be implemented, so that the chip may be miniaturized. Furthermore, a Balun transformer for voltage combination is already implemented in a CMOS, so that no additional circuit is required in a typical amplifier.

Furthermore, although a structure using an impedance transformer relates to a current combining method, an amplifier suggested by the present invention relates to a voltage combining method. Therefore, loss at an output terminal is relatively small. Moreover, the present invention controls an amplifier without a device such as a switch, so that no loss from that occurs and ease of use is provided.

As described above, the power amplifier of the present invention can have high efficiency and excellent linearity.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A power amplifier comprising:
a main amplifying unit receiving power;
an auxiliary amplifying unit connected in parallel to the main amplifying unit; and
a Balun transformer connected to the main amplifying unit and the auxiliary amplifying unit, and configured to generate output voltages by transforming outputs of the main amplifying unit and the auxiliary amplifying unit, respectively, and combine the output voltages to deliver a sum of the output voltages to a load impedance,
wherein different bias voltages are applied to the main amplifying unit and the auxiliary amplifying unit, respectively, to maintain different bias conditions in the main amplifying unit and the auxiliary amplifying unit during operation of the power amplifier, and
wherein the main amplifying unit comprises a first main amplifier and a second main amplifier and different bias voltages are inputted to the first main amplifier and the second main amplifier.

2. The power amplifier of claim 1, wherein the Balun transformer has a transformation ratio of 1:1.

3. The power amplifier of claim 1, wherein a voltage input to the main amplifying unit and the auxiliary amplifying unit is distributed by the Balun transformer.

4. The power amplifier of claim 1, wherein a bias condition of the main amplifying unit is class AB.

5. The power amplifier of claim 1, wherein a bias condition of the auxiliary amplifying unit is class C.

6. The power amplifier of claim 1, wherein the auxiliary amplifying unit comprises a first auxiliary amplifier and a second auxiliary amplifier; and
different bias voltages are inputted to the first auxiliary amplifier and the second auxiliary amplifier.

7. The power amplifier of claim 1, wherein an offset line is connected to the auxiliary amplifying unit.

8. The power amplifier of claim 7, wherein the offset line is connected to the main amplifying unit.

9. The power amplifier of claim 1, wherein the Balun transformer comprises a first transformer and a second transformer, and
wherein the first transformer is connected to the first main amplifier and the second transformer is connected to the second main amplifier.

10. The power amplifier of claim 9, wherein a first load impedance seen by the first transformer is modulated by the first transformer and a second load impedance seen by the second transformer is modulated by the second transformer.

11. The power amplifier of claim 1, wherein the auxiliary amplifying unit starts to operate at an input voltage level at which the main amplifying unit becomes saturated.

12. The power amplifier of claim 1, wherein the Balun transformer is implemented in a CMOS chip.

13. A power amplifying method comprising:
distributing an input voltage as first and second input voltages;
applying the first and second input voltages to first and second amplifiers having different bias conditions, respectively, to maintain different bias conditions in the first and second amplifiers during operation of a power amplifier including the first and second amplifiers; and
transforming, using a Balun transformer, outputs from the first and second amplifiers, respectively, to generate output voltages and combining, using the Balun transformer, the output voltages to deliver a sum of the output voltages to a load impedance,
wherein the first amplifier comprises a first main amplifier and a second main amplifier,
wherein the Balun transformer comprises a first transformer and a second transformer, and
wherein the first transformer is connected to the first main amplifier and the second transformer is connected to the second main amplifier.

14. The method of claim 13, wherein the first and second transformers of the Balun transformer each have a transformation ratio of 1:1.

15. The method of claim 13, wherein each of the first and second amplifiers comprises an offset line.

16. The method of claim 13, wherein a bias condition of the first amplifier is class AB.

17. The method of claim 13, wherein a bias condition of the second amplifier is class C.

18. A power amplifier comprising:
a main amplifying unit receiving power;
an auxiliary amplifying unit connected in parallel to the main amplifying unit; and
a Balun transformer connected to the main amplifying unit and the auxiliary amplifying unit, and configured to generate output voltages by transforming outputs of the main amplifying unit and the auxiliary amplifying unit, respectively, and combine the output voltages to deliver a sum of the output voltages to a load impedance,
wherein different bias voltages are applied to the main amplifying unit and the auxiliary amplifying unit, respectively, to maintain different bias conditions in the main amplifying unit and the auxiliary amplifying unit during operation of the power amplifier,
wherein the main amplifying unit comprises a first main amplifier and a second main amplifier,
wherein the auxiliary amplifying unit comprises a first auxiliary amplifier and a second auxiliary amplifier,
wherein the Balun transformer comprises first, second, third, and fourth transformers,
wherein the first transformer is connected to the first main amplifier and the second transformer is connected to the second main amplifier, and
wherein the third transformer is connected to the first auxiliary amplifier and the fourth transformer is connected to the second auxiliary amplifier.

19. The power amplifier of claim 18, wherein each of the first, second, third, and fourth transformers have a transformation ratio of 1:1.

* * * * *